United States Patent [19]
Kasuta

[11] Patent Number: 5,576,998
[45] Date of Patent: Nov. 19, 1996

[54] SEMICONDUCTOR MEMORY DEVICE

[75] Inventor: Yoshinori Kasuta, Kawasaki, Japan

[73] Assignee: Fujitsu Limited, Kawasaki, Japan

[21] Appl. No.: 439,110

[22] Filed: May 11, 1995

[30] Foreign Application Priority Data

Jul. 18, 1994 [JP] Japan ..................... 6-165363

[51] Int. Cl.⁶ .................................. G11C 13/00
[52] U.S. Cl. .................... 365/189.06; 365/182
[58] Field of Search ............... 365/182, 189.01, 365/189.05, 189.06, 189.09

[56] References Cited

U.S. PATENT DOCUMENTS

5,504,704  4/1996  Sato et al. ........................ 365/182

Primary Examiner—Terrell W. Fears
Attorney, Agent, or Firm—Armstrong, Westerman, Hattori, McLeland & Naughton

[57] ABSTRACT

An object of the present invention is to provide a semiconductor memory device having a function to efficiently limit a voltage amplitude of an I/O line pair 4 to protect cell data from destruction even when multiple selection, etc., occurs at a column gate 3. A semiconductor memory device 1 constituted by DRAM, etc., for transferring cell data amplified by a sense amplifier 2 to an I/O line pair 4 through a transfer gate 3, comprises an amplitude limiting means 5 for limiting the amplitude of a voltage, provided to the I/O line pair 4 in activation, wherein the amplitude limiting means 5 includes a first amplitude limiting circuit 51 having a predetermined operating range and a second amplitude limiting circuit 52 having an operating range different from the operating range of the first amplitude limiting circuit 51.

9 Claims, 5 Drawing Sheets

(PRIOR ART)

SEMICONDUCTOR MEMORY DEVICE

BACKGROUND OF THE INVENTION

1. Field of the Invention

This invention relates to a semiconductor memory device. More particularly, the present invention relates to a semiconductor memory device capable of limiting the voltage amplitude on an input/output line (I/O line) by utilizing an amplitude limiting means comprising a current load, or the like.

2. Description of the Related Art

Figure 8:
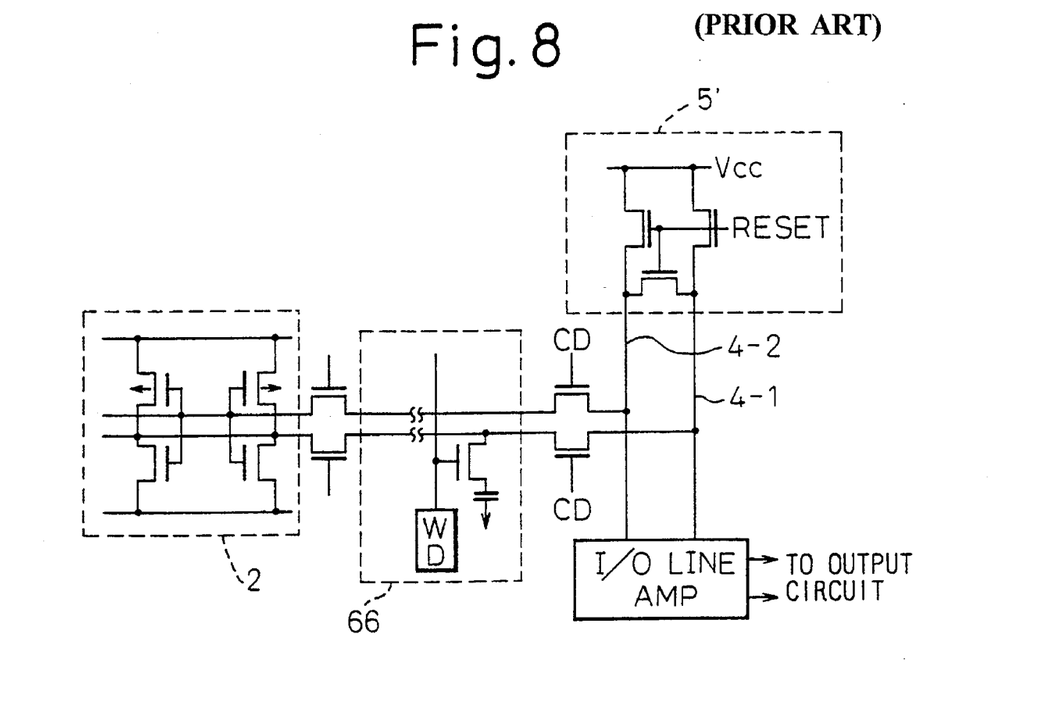
FIG. 8 is a block diagram useful for explaining another example of the circuit construction in the semiconductor memory device according to the prior art.

In a semiconductor memory device 1, a method which reads out data or information, from a cell 6 and amplified by a sense amplifier 2, to input/output line, that is, an I/O line pair 4, in which an I/O amplifier (AMP) 7 is provided, through a column line CL inclusive of a transfer gate 3 consisting of a column gate, etc., has been employed in the past, as shown in FIG. 8.

The demand for higher speed performance from the semiconductor memory device 1 having the above construction has increased in recent years. According to the prior art, the read operation for new data is carried out after a short reset operation is made whenever data, from the cell 6 in a cell array 66 and amplified by the sense amplifier, is individually read out. For this reason, the data readout operation requires time, and this is a problem for high speed performance.

In other words, in the semiconductor memory device 1 shown in FIG. 8, reset means 5' is provided to the I/O line pair 4, and whenever the data from the cell 6 in the cell array 66 amplified by the sense amplifier 2 is read out, the short reset operation is conducted and then the new data is read out. Accordingly, the data readout time is long and this is a problem for attaining a high operation speed.

Figure 9:
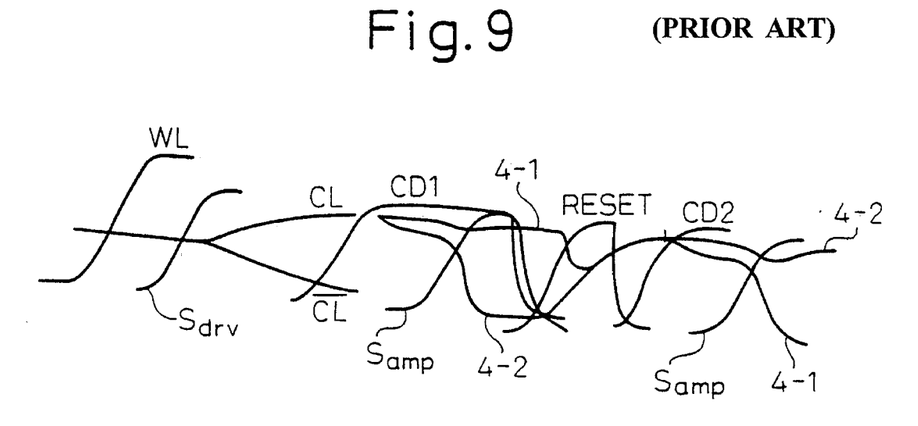
FIG. 9 is a graph showing an example of the output waveform at each output terminal of the semiconductor memory device according to the prior art shown in FIG. 8.

More concretely, FIG. 9 shows the output waveform in the semiconductor memory device shown in FIG. 8.

Referring to FIG. 9, when a driving signal Sdrv of the sense amplifier 2 changes simultaneously with the change of a word line WL, a potential difference is generated between column lines CL and/CL (CL bar), and then a column decoder 1 (CD1) is selected and activated. Therefore, a predetermined potential difference is generated between the I/O line pairs 4-1 and 4-2, and in the mean while, the driving signal Samp of the I/O amplifier (AMP) 7 rises.

However, after the column decoder 1 (CD1) enters the non-selected state, the resent means 5' outputs the reset signal (Rset) before the column decoder 2 (CD2) is subsequently selected afresh, and the short reset operation is executed.

Figure 5:
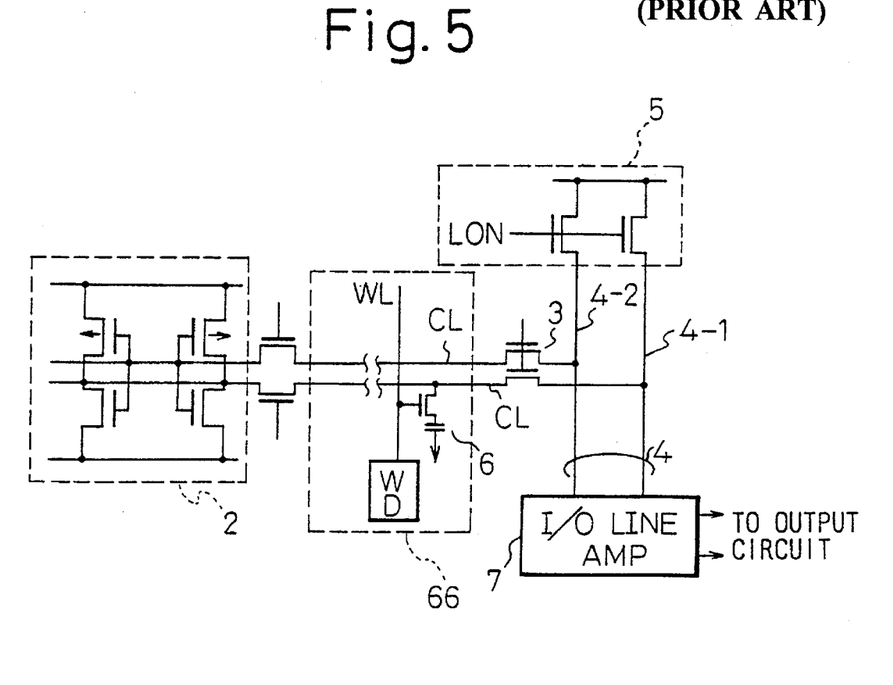
FIG. 5 is a block diagram useful for explaining a circuit construction in a semiconductor memory device according to the prior art.

On the other hand, as a method of improving the conventional example described above, a semiconductor memory device 1 shown in FIG. 5 is known. Namely, this is the semiconductor memory device having basically the circuit construction shown in FIG. 8, wherein amplitude limiting means 5 comprising a current load, etc., is disposed so as to provide a suitable potential difference between the I/O line pair lest the information such as the data stored in the cell 6 is destroyed when the data of the cell 6 amplified by the sense amplifier 2 is read out to the input/output lines, that is, the I/O line pair 4, through the column line CL inclusive of the transfer gate 3 consisting of the column gate, etc.

In other words, in place of the short reset operation system according to the prior art, each of the I/O line pair 4 is connected to a power supply line through a transistor, and predetermined data is read out while the amplitude of the voltage applied to this I/O line pair is limited, as shown in FIG. 5.

In the semiconductor memory device having the current load system described above, when a voltage higher than a set value is applied to each line in the I/O line pair, for example, the data read out is destroyed when the data stored in each cell 6 of the cell array 66 is read out.

Figure 10:
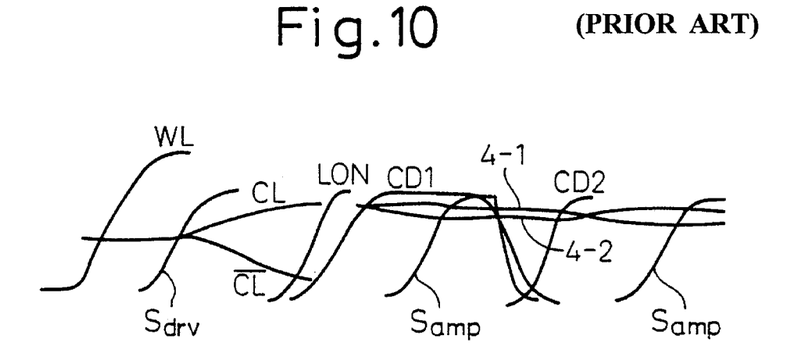
FIG. 10 is a graph showing an example of the output waveform at each output terminal of the semiconductor memory device according to the prior art shown in FIG. 5.

FIG. 10 is a graph showing the output waveform in another conventional example shown in FIG. 5.

In FIG. 10, when the driving signal Sdrv of the sense amplifier 2 changes simultaneously with the change of the word line WL in the same way as in FIG. 9, the potential difference is generated between the column lines CL and/CL (CL bar) but thereafter, the control signal (LON) of the amplitude limiting means 5 rises, unlike in FIG. 9, and at the same time, the column decoder 1 (CD1) is selected and rises, so that a predetermined potential difference is generated between the I/O line pair 4-1 and 4-2.

In the example shown in FIG. 10, however, the potential difference between the I/O line pair 4-1 and 4-2 is considerably smaller than the potential difference in FIG. 9.

After the column decoder (CD1) enters the non-selected state in the same way as in FIG. 9, the potential difference between the I/O line pair 4-1 and 4-2 is kept substantially constant and is detected during the time in which the column decoder 2 (CD2) is again selected.

In other words, in the concrete example shown in FIG. 5, the operation speed becomes faster to the extent corresponding to non-execution of the short reset operation, and an erroneous operation might occur unless the amplitude is limited to a certain value. Another problem is that if the amplitude is excessively limited to a low level, the data cannot be read out.

In the prior art devices, therefore, the capacity of the sense amplifier 2, the I/O line pair 4 and the transfer gate (column gate) 3 for connecting them has been strictly set lest the data read out from the cell is destroyed, and design is made so that the sense amplifier, the I/O lines and the I/O amplifier 7 keep a predetermined balance.

In other words, the semiconductor memory device according to the prior art described above is equipped with the amplitude limiting means 5 comprising the current load, etc., for limiting the voltage applied to the I/O lines or the potential difference between the I/O line pair 4 to a level at which the data read out is not destroyed. Because this amplitude limiting means 5 limits the current value flowing through the I/O lines 4, the voltage amplitude between the I/O line pair 4 is limited to a predetermined value.

Figure 6:
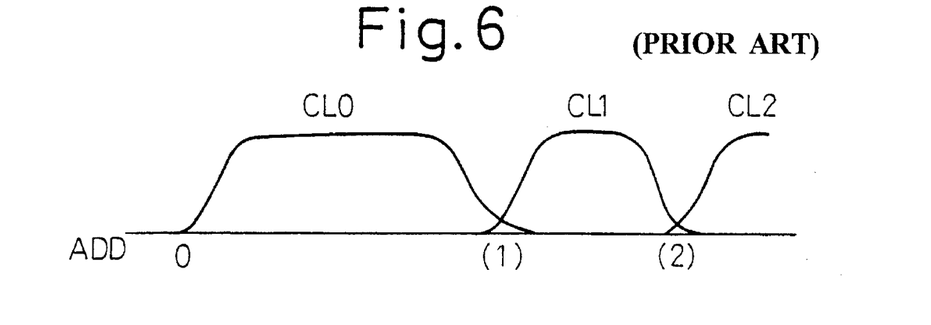
FIG. 6 is a graph showing an example of normal waveforms at the time of data readout of a column line according to the prior art.

However, even such a semiconductor memory device is not free the following problem. Namely, when a resistance component is parasitically coupled with the transfer gate 3 or with the column line CL, for example, or when any noise is contained in the input signal, dullness occurs in a part of the waveform N as shown in FIG. 7 and a skew occurs between the output waveform of the column line CL of the next stage, although, in the normal case, substantially the same waveform appears in accordance with the address signal and the "H" level and the "L" level repeat, as shown in FIG. 6.

Figure 7:
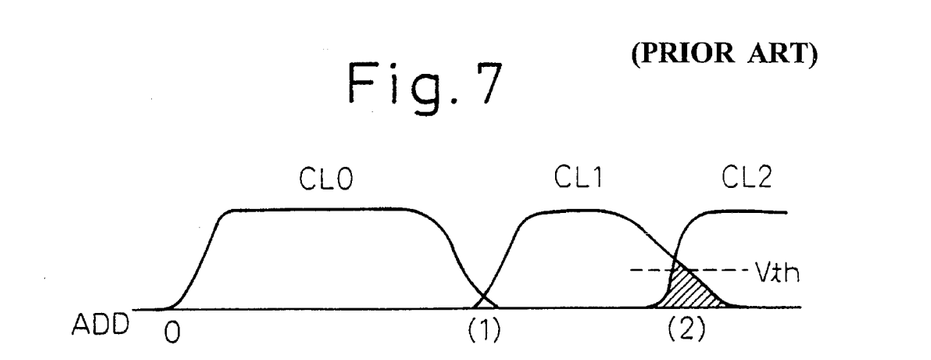
FIG. 7 is a graph showing the waveforms representing the occurrence of multiple selection at the time of data readout of a column line according to the prior art.

In such a case, if the threshold value Vth of the transistor constituting the column gate 3 overlaps with the N portion as shown in FIG. 7, multiple selection occurs between the column gate of the preceding stage and the column gate 3 of the next stage and results in the erroneous operation. When such a multiple selection occurs in the column gate corresponding to a plurality of cells, the potential difference between the I/O line pair becomes very large, and the balance between the current supply capacity of this current load 5 and the current capacity of the sense amplifier disappears so that the amplitude of the I/O lines becomes large.

When the amplitude of the I/O line pair becomes large, a larger current is allowed to flow from the I/O lines and the amplitude can be limited, but when the current quantity becomes large, the cell data will be destroyed.

SUMMARY OF THE INVENTION

The object of the present invention is to provide a semiconductor memory device which removes the problems with the prior art described above, and has the function of efficiently limiting the voltage amplitude of the I/O line pair 4 even when multiple selection of the column gate 3, etc., occurs, lest the cell data is destroyed.

To accomplish the object described above, the present invention employs the following technical construction. Namely, in a semiconductor memory device for transferring cell data amplified by a sense amplifier to input/output lines (I/O lines) through a transfer gate, the semiconductor memory device according to the present invention is equipped with amplitude limiting means for limiting the amplitude of the voltage, provided to the input/output lines, wherein the amplitude limiting means includes a first amplitude limiting circuit having a predetermined operation range and a second amplitude limiting circuit having an operation range different from the operation range of the first amplitude limiting circuit.

The semiconductor memory device according to the present invention has the technical construction described above. Therefore, so long as the voltage amplitude between the I/O line pair in this semiconductor memory device is normal, the first amplitude limiting circuit is operated so as to supply the current necessary for keeping the amplitude between the I/O line pair, and when the voltage amplitude between the I/O line pair is not normal, the second amplitude limiting circuit is operated to supply a greater quantity of the current than the current supplied by the first amplitude limiting circuit to the I/O line pair, so that the abnormal voltage amplitude can be restricted. Accordingly, even when an abnormal state such as multiple selection occurs, a suitable quantity of the current is temporarily supplied from the second amplitude limiting circuit to the I/O lines, and the amplitude between the I/O line pair can be decreased without destroying the cell data.

DETAILED DESCRIPTION OF THE PREFERRED EMBODIMENT

Hereinafter, a definite example of the semiconductor memory device 1 according to the present invention will be explained in detail with reference to the accompanying drawings.

Figure 1:
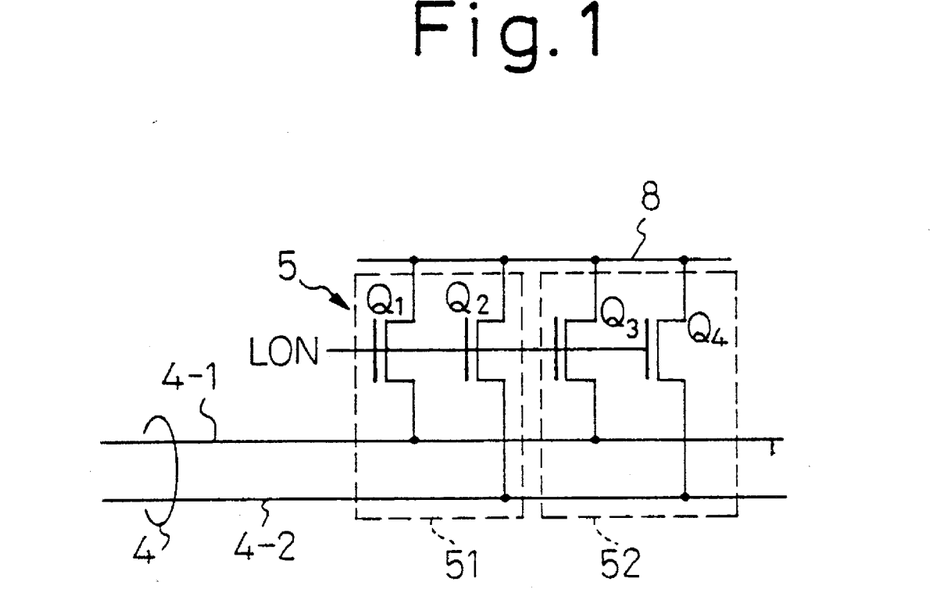
FIG. 1 is a block diagram useful for explaining the outline of the construction of the amplitude limiting means used in a semiconductor memory device according to the present invention.

FIG. 1 is a circuit diagram showing an example of the construction of amplitude limiting means 5 used in the semiconductor memory device constituted by DRAM, etc., according to the present invention. In the drawing, in the semiconductor memory device 1 for transferring the cell data amplified by the sense amplifier 2 to the I/O line pair 4 through the transfer gate 3, the amplitude limiting means 5 for limiting the amplitude of the voltage is provided to the I/O line pair 4 in activation, and this amplitude limiting means 5 includes the first amplitude limiting circuit 51 having a predetermined operation range and the second amplitude limiting circuit 52 having an operation range different from the operation range of the first amplitude limiting circuit 51.

In other words, in the semiconductor memory device according to the present invention, such as a DRAM, the amplitude limiting means 5 is provided with the function of supplying a relatively small quantity of current while the potential difference between the I/O line pair is within a predetermined normal range, and with the function of supplying a relatively large quantity of current to reduce the potential difference between the I/O line pair when the potential difference between the I/O line pair exceeds the predetermined normal range described above. The problems with the prior art can be solved by causing both of these functions to selectively operate.

Here, the case where the potential difference between the I/O line pair falls within the predetermined normal range in the present invention represents the condition where the capacity of each of the sense amplifier 2, the I/O line pair 5 and the transfer gate 3 (column gate) connecting them is strictly set, and the predetermined balance is kept between the sense amplifier and the I/O lines and the I/O amplifier 7 to prevent destruction of the data read out of the cell and the memory device is kept in the environment in which the erroneous operation occurs, as already described.

Accordingly, as the more concrete construction of the semiconductor memory device 1 according to the present invention, the operating range of the first amplitude limiting circuit 51 in the amplitude limiting means 5 is set so that is operates while the potential difference between the input/output line (I/O line) pair exists within a predetermined normal range and, within such an operating range, a predetermined current value is supplied to the I/O line pair.

The operating range of the second amplitude limiting circuit 52 in the amplitude limiting means 5 is set so that the circuit operates while the potential difference generated between the input/output line (I/O line) pair exceeds the predetermined normal range, and is such an operating range, a current value greater than the supply current quantity in the first amplitude limiting circuit is supplied.

In other words, the operating ranges of the first and second amplitude limiting circuits 51, 52 in the amplitude limiting means 5 in the present invention are set to ranges in which the semiconductor memory device does not effect the erroneous operation, and particularly the second amplitude limiting circuit 52 detects in advance the occurrence of the condition, in which the erroneous operation of the semiconductor memory device is anticipated, supplies a predetermined, relatively larger current between the I/O line pair, and restricts an increase in the amplitude.

A concrete example of the amplitude limiting means 5 of the semiconductor memory device 1 according to the present invention is constituted by disposing transistors such as MOSFETs which are connected between the I/O lines 4-1 and 4-2 of the I/O line pair 4 and the power supply line 8 as shown in FIG. 1. The amplitude limiting circuit 51 comprises a MOSFET Q1, the source and drain of which are connected between the power supply line 8 and the I/O line 4-1, and another MOSFET Q2, the source and drain of which are connected between the power supply line 8 and the I/O line 4-2. The second amplitude limiting circuit 52 comprises a MOSFET Q3, the source and drain of which are connected between the power supply line 8 and the I/O line 4-1, and another MOSFET Q4, the source and the drain of which are connected between the power supply line 8 and the I/O line 4-2, and these first and second amplitude limiting circuits 51 and 52 together constitute the amplitude limiting means 5. The gate of each of these MOSFETs Q1 to Q4 is connected to a common signal output terminal portion LON.

A signal for turning ON the MOSFETs is generally outputted to the signal output terminal LON.

In order to accomplish the afore-mentioned object and the function and effect of the invention, the threshold value Vth of the MOSFETs Q1 and Q2 constituting the first amplitude limiting circuit 51 is set to be lower than the threshold value Vth' of the MOSFETs Q3 and Q4 constituting the second amplitude limiting circuit 52, and the conductance value gm, which represents the current supply capacity of the MOSFETs Q1 and Q2, is set to be lower than the conductance value gm' representing the current supply capacity of the MOSFETs Q3 and Q4.

In other words:

$Vth < Vth'$ and $gm$ (Q1, Q2) $<< gm'$ (Q3, Q4).

Accordingly, in the concrete example of the semiconductor memory device 1 according to the present invention described above, an "H" level signal higher than the threshold value Vth of the MOSFETs Q1 and Q2 is inputted to the common signal output terminal portion LON under the normal state where the amplitude between the I/O line pair is below a predetermined level, so as to thereby drive the MOSFETs Q1 and Q2 in the first amplitude limiting circuit 51. In this way, a predetermined quantity of the current, which is limited by these MOSFETs Q1 and Q2, is supplied to the I/O line pair, and the data is read out and written.

In the mean time, the MOSFETs Q3 and Q4 constituting the amplitude limiting circuit 52 are kept in the non-driven state.

However, when the amplitude of the voltage between the I/O line pair exceeds the predetermined level, for some reason or other, and the semiconductor memory device causes an erroneous operation, the MOSFETs Q3 and Q4 are turned ON if the potential difference between the voltage of the I/O line and the signal voltage applied to the gates of the MOSFETs Q3 and Q4 becomes greater than the threshold value Vth' of these MOSFETs Q3 and Q4. Accordingly, a current which is limited by the MOSFETs Q3 and Q4 is supplied to the I/O line pair. After all, the sum of the current supplied to the I/O line pair by the first amplitude limiting circuit 51 and the current supplied to the I/O line pair by the second amplitude limiting circuit 52 flows through this I/O line pair, and the potential of at least one of the I/O lines constituting the I/O line pair rises. As a result, the potential difference between the I/O line pair drops, and the state returns to the normal state, having a good balance, as described above.

The transistors constituting the amplitude limiting circuits 1 and 2 according to the present invention may be bipolar transistors and, besides transistors, a circuit exhibiting the same function as described above can also be used.

Figure 2:
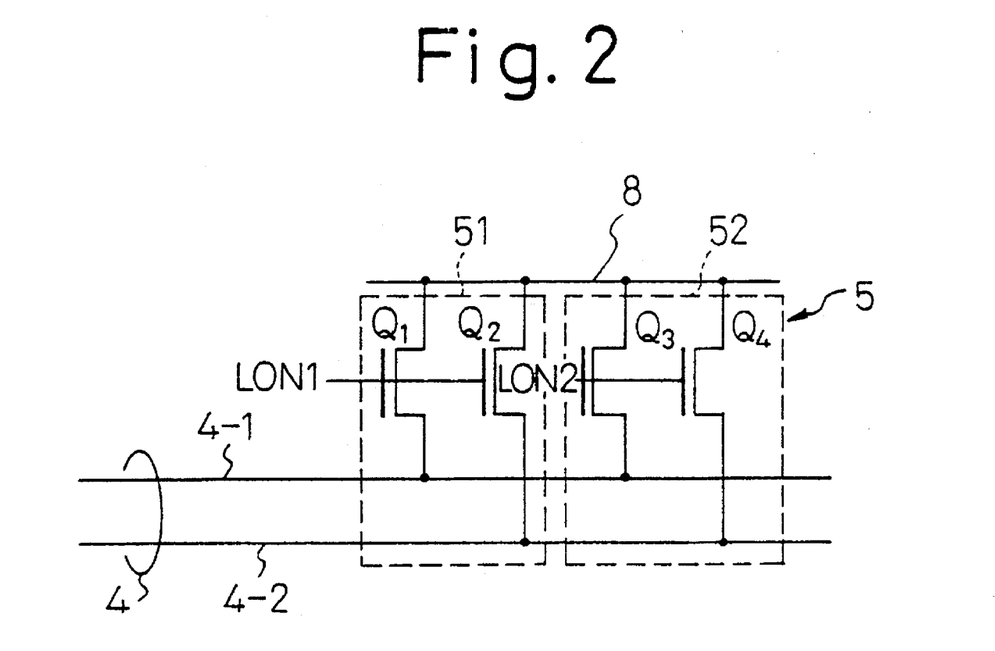
FIG. 2 is a block diagram showing another structural example of the amplitude limiting circuit according to the present invention.

FIG. 2 shows the construction of another concrete example of the amplitude limiting means 5 in the semiconductor memory device 1 according to the present invention. Though the construction of each of the first and second amplitude limiting circuits 51 and 52 is the same as that of the current limiting circuits shown in FIG. 1, the difference resides in that the common gate of each MOSFET Q1, Q2 of the first amplitude limiting circuit 51 is separated from the common gate of each MOSFET Q3, Q4 constituting the second amplitude limiting circuit 52, and mutually different control signals LON1 and LON2 are applied to them, respectively.

Accordingly, the relation of the threshold values between the MOSFETs Q1, Q2 constituting the first amplitude limiting circuit 51 and the MOSFETs Q3, Q4 constituting the second amplitude limiting circuit 52, or the relation of their current supply capacity, may be the same as that of the concrete example shown in FIG. 1.

In this concrete example, the second amplitude limiting circuit 52 is so constituted as to arbitrarily stop the operation of the second amplitude limiting circuit 52.

In other words, when the potential difference between the I/O line pair expands, for some reason or other, during driving of the semiconductor memory device 1 of the present invention and the voltage amplitude becomes great, the second amplitude limiting circuit 52 starts operating and causes a large current to flow through the I/O line pair so as to limit this amplitude as described above, but the operation of removing the cause of the increase of the amplitude is necessary, too. In such a case, the operation of the second amplitude limiting circuit 52 must be stopped.

Accordingly, to cope with such a situation, this embodiment applies an "L" level control signal, for example, to the common gate of the second amplitude limiting circuit 52 to stop the operation of the second amplitude limiting circuit while the first amplitude limiting circuit 51 is kept under the driving state as such, and in this way, driving of the second amplitude limiting circuit 52 is temporarily stopped.

In the mean time, the operation of screening for the cause for the trouble is executed, and as a result, the yield of the semiconductor memory device 1 can be improved.

Figure 3:
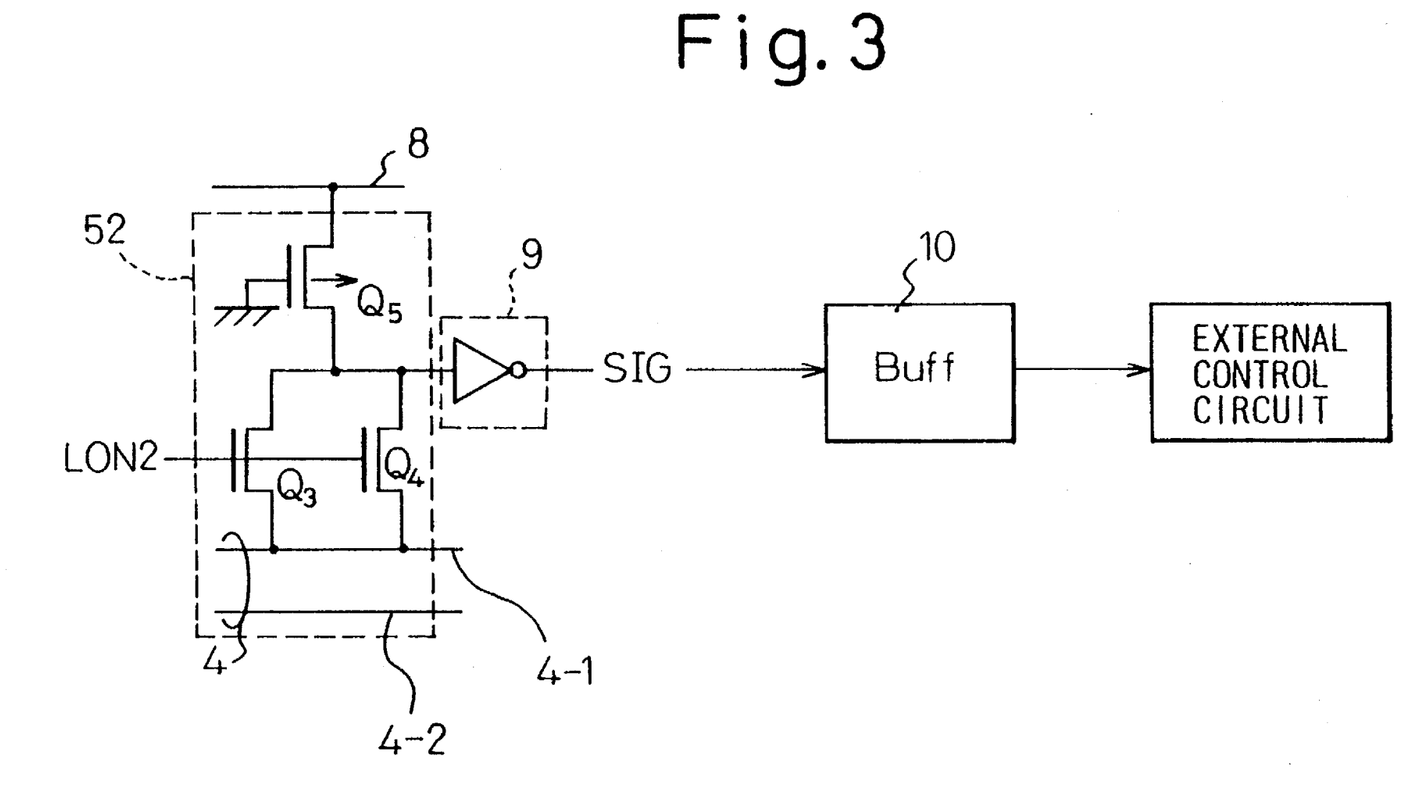
FIG. 3 is a circuit diagram showing another structural example of the second amplitude limiting circuit according to the present invention.

FIG. 3 shows another structural example of the second amplitude limiting circuit 5 in the amplitude limiting means 5 in the present invention.

In other words, the construction of the first amplitude limiting circuit 51 of the amplitude limiting means 5 in this embodiment may be the same as the construction of FIG. 1, but the characterizing feature of the construction of the second amplitude limiting circuit 52 resides in that means 9 for detecting the second amplitude limiting circuit 52 is provided, and furthermore, control means 10 for controlling the semiconductor memory device 1 in response to the means 9 for detecting the operating condition of the second amplitude limiting circuit 52 is provided.

In other words, as can be understood clearly from FIG. 3, the amplitude limiting circuit 52 in this embodiment comprises the MOSFETs Q3 and Q4 that constitute the second amplitude limiting circuit 51 in FIG. 1, the gates of these MOSFETs Q3, Q4 are made common, and the predetermined control signal described above is inputted to this common gate.

Further, in this embodiment, the sources of the MOSFETs Q3 and Q4 are connected in common, and are connected to the power supply line 8 through a transistor such as a P-channel MOSFET Q5.

The base of this P-channel MOSFET Q5 may be grounded, for example.

This MOSFET Q5 operates as a charge-up circuit.

In this embodiment, an operating state detection means 9 for the second amplitude limiting circuit 52 is disposed at the common source portion of the MOSFETs Q3 and Q4 so as to detect the voltage at the common source.

Such an operation state detection means 9 may use a suitable comparison circuit, an inverter, a switching circuit, or the like.

In other words, the amplitude limiting circuit 52 in this embodiment starts operating when the amplitude of the voltage between the I/O line pair exceeds the predetermined amplitude level, and for this reason, the voltage at the common source of the MOSFETs Q3 and Q4 drops. This drop is detected by the detection means 9, which then outputs the detection signal SIG.

Furthermore, in this embodiment, the second amplitude limiting circuit 52 is preferably provided with control means 10 for controlling the semiconductor memory device 1 in response to the output of the detection means 9 for detecting the operation state of the second amplitude limiting circuit 52.

In other words, in this embodiment, the output of the operating state detection means 9 of the second amplitude limiting circuit 52 such as the circuit shown in FIG. 3 is used to operate the control means 10 inclusive of an alarm, a display or like means, through a suitable buffer circuit or an amplification circuit, so that the semiconductor memory device 1 can be automatically stopped or an alarm is raised to warn the operator that the erroneous operation might occur.

Figure 4:
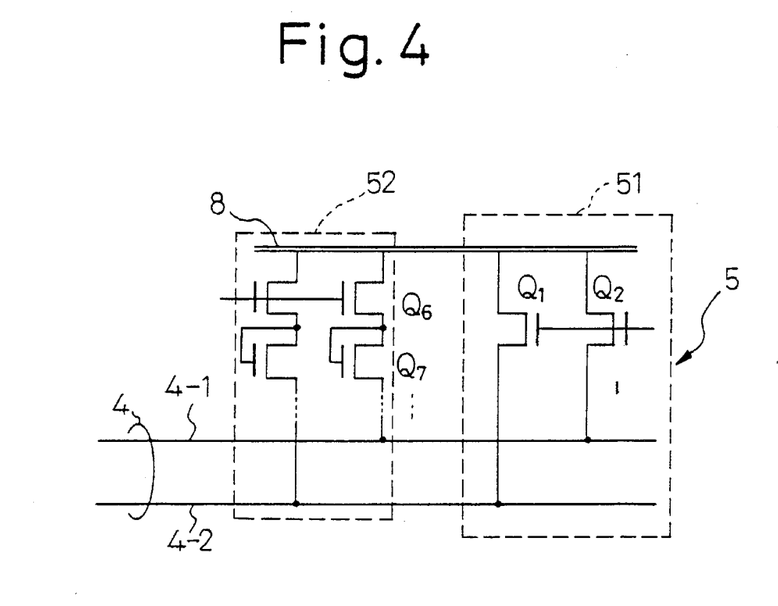
FIG. 4 is a block diagram showing another structural example of the amplitude limiting circuit according to the present invention.

FIG. 4 shows another structural example of the amplitude limiting means 5 shown in FIG. 1 and used for the semiconductor memory device 1 according to the present invention.

In the structural example shown in FIG. 1, the number of the transistors constituting the first amplitude limiting circuit 51 is equal to the number of the transistors constituting the second amplitude limiting circuit 52, but the threshold value and the current supply capacity of the transistors constituting the respective amplitude limiting circuits 51 and 52 are different. In this embodiment, however, the transistor construction of the first amplitude limiting circuit 51 is the same as that shown in FIG. 1, but the number of series connection of the same transistors Q6, Q7 . . . Qn used in the second amplitude limiting circuit 52 is changed so that the threshold value can be changed by utilizing the voltage drop by each transistor, and the difference voltage access the I/O line pair can be detected.

In the embodiment of the present invention shown in FIG. 1, the threshold value Vth of each of the MOSFETs Q1, Q2 constituting the first amplitude limiting circuit 51 is 0.45 V, for example, and the threshold value Vth' of each of the MOSFETs Q3, Q4 constituting the second amplitude limiting circuit 52 is 0.98 V, for example.

When the current supply capacity gm of each MOSFET Q1, Q2 is calculated in terms of a saturation current $I_D$, $I_D$ is 5.8 mA, and a saturation current $I_D$ of each MOSFET Q3, Q4 is 58 mA.

Effect of the Invention

Since the present invention employs the technical construction described above, the second current load is constituted by transistors having a higher threshold value Vth and greater current supply capacity than those of the transistors constituting the first current load, in parallel with the ordinary current load, that is, the first current load. Accordingly, the second current load operates and supplies a large current only when the amplitude of the I/O line pair changes much more than the threshold value Vth of the transistors constituting the second current load, and can thus efficiently prevent the amplitude of the I/O line pair from becoming larger.

Accordingly, even when multiple selection of the column gate occurs in the semiconductor memory device, the amplitude of the I/O line pair can be controlled, and destruction of the cell data can be prevented. Further, the erroneous operation can be avoided by detecting the operation of the second amplitude limiting circuit 52, and the reliability of the semiconductor memory device can be improved in consequence.

I claim:

1. A semiconductor memory device for transferring cell data, amplified by a sense amplifier, to an input/output line (I/O line) through a transfer gate, comprising:
   an amplitude limiting means for limiting the amplitude of a voltage on said input/output line (I/O line) pair which are actuated; wherein said amplitude limiting means includes a first amplitude limiting circuit having a predetermined operating range and a second amplitude limiting circuit having an operating range different from the operating range of said first amplitude limiting circuit.

2. A semiconductor memory device according to claim 1, wherein the operating range of said first amplitude limiting circuit in said amplitude limiting means is such that the potential difference generated between said input/output line (I/O line) pair is set to be lower than a predetermined value.

3. A semiconductor memory device according to claim 1, wherein the operation range of said second amplitude limiting circuit in said amplitude limiting means is such that the potential difference generated between said input/output line (I/O line) pair is set to be greater than that in said operating range in said first amplitude limiting circuit.

4. A semiconductor memory device according to claim 1 or claim 3, wherein means for arbitrarily stopping the operation of said second amplitude limiting circuit is provided to said second amplitude limiting circuit.

5. A semiconductor memory device according to claim 1 or claim 3, wherein means for detecting the operating state of said second amplitude limiting circuit is provided to said second amplitude limiting circuit.

6. A semiconductor memory device according to claim 5, wherein control means for controlling said semiconductor memory device in response to said means for detecting the operating state of said second amplitude limiting circuit is provided to said second amplitude limiting circuit.

7. A semiconductor memory device for transferring cell data, amplified by a sense amplifier, to an input/output line (I/O line) through a transfer gate, comprising:

an amplitude limiting circuitry for limiting the amplitude of a voltage on said input/output line (I/O line) pair which are actuated; wherein said amplitude limiting circuity includes a first amplitude limiting circuit having a predetermined operating range and a second amplitude limiting circuit having an operating range different from the operating range of said first amplitude limiting circuit.

8. A semiconductor memory device according to claim 4, wherein means for detecting the operating state of said second amplitude limiting circuit is provided to said second amplitude limiting circuit.

9. A semiconductor memory device according to claim 8, wherein control means for controlling said semiconductor memory device in response to said means for detecting the operating state of said second amplitude limiting circuit is provided to said second amplitude limiting circuit.

* * * * *